US010431564B2

(12) United States Patent
Lin

(10) Patent No.: US 10,431,564 B2
(45) Date of Patent: Oct. 1, 2019

(54) STRUCTURE AND FORMATION METHOD OF CHIP PACKAGE STRUCTURE

(71) Applicant: MediaTek inc., Hsin-Chu (TW)

(72) Inventor: Tzu-Hung Lin, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/539,180

(22) Filed: Nov. 12, 2014

(65) Prior Publication Data

US 2015/0214192 A1    Jul. 30, 2015

Related U.S. Application Data

(60) Provisional application No. 61/931,787, filed on Jan. 27, 2014.

(51) Int. Cl.
*H01L 23/36* (2006.01)
*H01L 25/00* (2006.01)
(Continued)

(52) U.S. Cl.
CPC ........ *H01L 25/0657* (2013.01); *H01L 23/367* (2013.01); *H01L 23/3677* (2013.01); *H01L 23/3736* (2013.01); *H01L 23/49816* (2013.01); *H01L 24/17* (2013.01); *H01L 24/33* (2013.01); *H01L 24/81* (2013.01); *H01L 24/83* (2013.01); *H01L 23/3128* (2013.01); *H01L 24/16* (2013.01); *H01L 24/48* (2013.01);
(Continued)

(58) Field of Classification Search
CPC ... H01L 25/06; H01L 25/065; H01L 25/0655; H01L 25/10; H01L 25/105; H01L 25/50; H01L 24/16; H01L 24/48; H01L 24/73; H01L 23/36; H01L 23/367; H01L 23/3677; H01L 23/373; H01L 23/3736; H01L 23/49; H01L 23/498; H01L 23/4981; H01L 23/49816
USPC ........................................................ 257/666
See application file for complete search history.

(56) References Cited

U.S. PATENT DOCUMENTS 5,834,848 A * 11/1998 Iwasaki .......................... 257/778
6,349,033 B1 * 2/2002 Dubin et al. .................. 361/704
(Continued)

FOREIGN PATENT DOCUMENTS

EP    0 690 500        1/1996
EP    1256980 A2    11/2002
(Continued)

OTHER PUBLICATIONS

Wilson, Jim, Thermal Conductivity of Solders, Aug. 1, 2006, https://www.electronics-cooling.com/2006/08/thermal-conductivity-of-solders/ Table 1.*

*Primary Examiner* — Monica D Harrison
(74) *Attorney, Agent, or Firm* — Wolf, Greenfield & Sacks, P.C.

(57) ABSTRACT

A chip package structure and a method for forming a chip package are provided. The chip package structure includes a chip package over a printed circuit board and multiple conductive bumps between the chip package and the printed circuit board. The chip package structure also includes one or more thermal conductive elements between the chip package and the printed circuit board. The thermal conductive element has a thermal conductivity higher than a thermal conductivity of each of the conductive bumps.

14 Claims, 4 Drawing Sheets

(51) Int. Cl.
*H01L 25/065* (2006.01)
*H01L 23/367* (2006.01)
*H01L 23/498* (2006.01)
*H01L 23/373* (2006.01)
*H01L 23/00* (2006.01)
*H01L 23/31* (2006.01)
*H01L 25/10* (2006.01)

(52) U.S. Cl.
CPC .......... *H01L 24/73* (2013.01); *H01L 25/0655* (2013.01); *H01L 25/105* (2013.01); *H01L 25/50* (2013.01); *H01L 2224/16113* (2013.01); *H01L 2224/16227* (2013.01); *H01L 2224/17134* (2013.01); *H01L 2224/17164* (2013.01); *H01L 2224/17519* (2013.01); *H01L 2224/29013* (2013.01); *H01L 2224/29084* (2013.01); *H01L 2224/29147* (2013.01); *H01L 2224/32113* (2013.01); *H01L 2224/32145* (2013.01); *H01L 2224/32225* (2013.01); *H01L 2224/32227* (2013.01); *H01L 2224/33134* (2013.01); *H01L 2224/33164* (2013.01); *H01L 2224/48091* (2013.01); *H01L 2224/48227* (2013.01); *H01L 2224/73203* (2013.01); *H01L 2224/73257* (2013.01); *H01L 2224/73265* (2013.01); *H01L 2224/81801* (2013.01); *H01L 2224/83801* (2013.01); *H01L 2225/0651* (2013.01); *H01L 2225/06513* (2013.01); *H01L 2225/06517* (2013.01); *H01L 2225/06568* (2013.01); *H01L 2225/06589* (2013.01); *H01L 2225/1023* (2013.01); *H01L 2225/1058* (2013.01); *H01L 2225/1094* (2013.01); *H01L 2924/00014* (2013.01); *H01L 2924/1533* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 6,396,135 B1* | 5/2002 | Narvaez et al. | 257/678 |
| 6,790,710 B2* | 9/2004 | McLellan | H01L 21/566 257/E23.004 |
| 7,132,744 B2* | 11/2006 | Zhao et al. | 257/706 |
| 7,161,239 B2* | 1/2007 | Zhao | H01L 23/24 257/706 |
| 7,327,028 B2* | 2/2008 | Chiu | 257/713 |
| 7,514,768 B2* | 4/2009 | Andoh | 257/668 |
| 8,084,850 B2* | 12/2011 | Shin | H01L 23/24 257/684 |
| 8,379,400 B2* | 2/2013 | Sunohara | 361/760 |
| 2003/0057550 A1 | 3/2003 | Zhao et al. | |
| 2005/0077613 A1 | 4/2005 | McLellan et al. | |
| 2005/0133906 A1 | 6/2005 | Woodall et al. | |
| 2008/0179737 A1 | 7/2008 | Haga et al. | |
| 2010/0327439 A1* | 12/2010 | Hwang | H01L 23/481 257/737 |
| 2011/0080713 A1 | 4/2011 | Sunohara | |
| 2011/0140272 A1 | 6/2011 | Zhao et al. | |
| 2012/0104598 A1 | 5/2012 | Hsu et al. | |
| 2015/0078810 A1* | 3/2015 | Koep | B23K 35/26 403/272 |

FOREIGN PATENT DOCUMENTS

| | | |
|---|---|---|
| TW | 410484 | 11/2000 |
| WO | WO 2013/142335 A1 | 9/2013 |

* cited by examiner

STRUCTURE AND FORMATION METHOD OF CHIP PACKAGE STRUCTURE

CROSS REFERENCE TO RELATED APPLICATIONS

This Application claims the benefit of U.S. Provisional Application No. 61/931,787, filed on Jan. 27, 2014, the entirety of which is incorporated by reference herein.

BACKGROUND

Field of the Disclosure

The disclosure relates to structures and formation methods of chip package structures, and in particular to structures and formation methods of chip package structures including multiple semiconductor dies.

Description of the Related Art

A chip package structure not only provides chips with protection from environmental contaminants, but it also provides a connection interface for the chips packaged therein. Stacked packaging schemes, such as package-on-package (POP) packaging, have become increasingly popular.

New packaging technologies have been developed to improve the density and functions of semiconductor devices. These relatively new types of packaging technologies for semiconductor devices face manufacturing challenges.

BRIEF SUMMARY OF THE DISCLOSURE

In accordance with some embodiments, a chip package structure is provided. The chip package structure includes a chip package over a printed circuit board and multiple conductive bumps between the chip package and the printed circuit board. The chip package structure also includes one or more thermal conductive elements between the chip package and the printed circuit board. The thermal conductive element has a thermal conductivity higher than a thermal conductivity of each of the conductive bumps.

In accordance with some embodiments, a method for forming a chip package structure is provided. The method includes providing a chip package and providing a printed circuit board. The method also includes bonding the chip package to the printed circuit board by multiple conductive bumps and one or more thermal conductive elements. The thermal conductive element has a thermal conductivity higher than a thermal conductivity of each of the conductive bumps.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
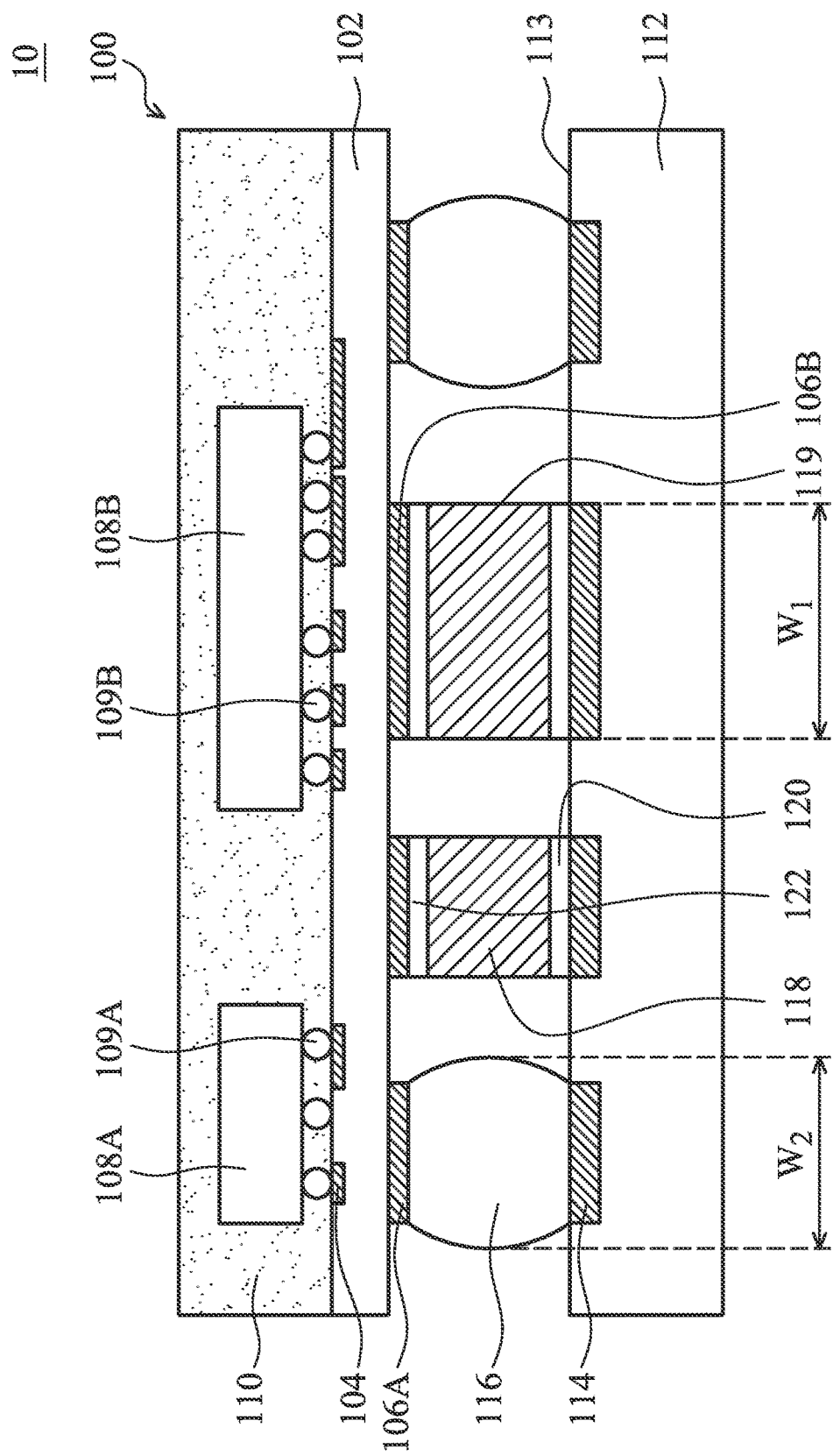
FIG. 1 is a cross-sectional view of a chip package structure, in accordance with some embodiments.

FIG. 1 is a cross-sectional view of a chip package structure 10, in accordance with some embodiments. In some embodiments, a chip package 100 is provided. In some embodiments, the chip package 100 includes a substrate 102. The substrate 102 may include a dielectric material such as an organic material. In some embodiments, the organic material includes polypropylene (PP) with glass fiber, epoxy resin, polyimide, cyanate ester, other suitable materials, or a combination thereof. In some other embodiments, the substrate 102 includes a semiconductor material such as silicon.

As shown in FIG. 1, conductive pads 104 and conductive pads 106A and 106B are formed over and/or at opposite surfaces of the substrate 102, in accordance with some embodiments. Each of the conductive pads 104 is electrically connected to a corresponding one of the conductive pads 106A or 106B. In some embodiments, conductive lines and/or conductive vias are formed in the substrate 102. The conductive lines and/or conductive vias form the electrical connections between conductive pads formed over and/or at opposite surfaces of the substrate 102.

In some embodiments, the chip package 100 includes one or more semiconductor dies such as semiconductor dies 108A and 108B. The semiconductor dies 108A and 108B are disposed over the substrate 102. In some embodiments, the semiconductor dies 108A and 108B have different functions. In some other embodiments, the semiconductor dies 208A and 208B have similar functions. In some embodiments, conductive elements 109A and 109B are formed between the substrate 102 and the semiconductor dies 108A and 108B, respectively. Each of the conductive elements 109A and 109B is electrically connected to the corresponding conductive pad 104.

In some embodiments, the chip package 100 includes a molding compound layer 110 formed over the substrate 102. The molding compound layer 110 surrounds the semiconductor dies 108A and 108B and protects the semiconductor dies 108A and 108B from being damaged and/or polluted.

As shown in FIG. 1, a printed circuit board 112 is provided, in accordance with some embodiments. The printed circuit board 112 includes multiple conductive pads 114 formed on or at a surface 113 of the printed circuit board 112. Afterwards, the chip package 100 is bonded to the printed circuit board 112 by multiple conductive elements 116 and one or more thermal conductive elements 118, as shown in FIG. 1 in accordance with some embodiments.

In some embodiments, the conductive elements 116 include solder bumps, solder balls, other suitable conductive structures, or a combination thereof. In some embodiments, the conductive element 116 has a curved sidewall surface, as shown in FIG. 1. In some embodiments, the thermal conductive element 118 has a thermal conductivity higher than that of the conductive element 116. In some embodiments, the thermal conductive element 118 includes a metal foil. For example, the metal foil includes a copper foil. In some other embodiments, the metal foil includes an aluminum foil. In some embodiments, the thermal conductive element 118 has a substantially planar sidewall surface 119. In some embodiments, the sidewall surface 119 is substantially perpendicular to the surface 113 of the printed circuit board 112. In some embodiments, the thermal conductive element 118 has a width $W_1$ wider than the width $W_2$ of the conductive element 116.

As shown in FIG. 1, a bonding layer 122 is formed between the chip package 100 and the thermal conductive element 118, and a bonding layer 120 is formed between the thermal conductive element 118 and the printed circuit board 112, in accordance with some embodiments. In some embodiments, the thermal conductive element 118, such as a metal foil, is picked and placed over the conductive pad 106B. In some embodiments, the thermal conductive element 118 is bonded to the chip package 100 by the bonding layer 122. For example, the conductive element 118 is bonded with the conductive pad 106B through the bonding layer 122. Afterwards, the thermal conductive element 118 is bonded to the printed circuit board 112, as shown in FIG. 1 in accordance with some embodiments. For example, the thermal conductive element 118 is bonded with the conductive pad 114 through the bonding layer 120.

In some embodiments, the bonding layers 122 and 120 are made of the same solder material. In some other embodiments, the bonding layers 122 and 120 are made of different solder materials. In some embodiments, the bonding layer 122 has a melting point higher than that of the bonding layer 120. In some cases, the bonding between the chip package 100 and the printed circuit board may be reworked. If the bonding layer 122 has a higher melting point than the bonding layer 120, the thermal conductive element 118 may remain connected to the chip package 100 after the printed circuit board is removed by heating the chip package structure. In some embodiments, the bonding layer 122 has a melting point of about 229 degrees C., and the bonding layer 120 has a melting point of about 220 degrees C. In some embodiments, each of the bonding layers 122 and 120 is made of an alloy of tin (Sn), silver (Ag), and copper (Cu). In some embodiments, the bonding layer 122 is made of SAC405 (Sn-4.0Ag-0.5Cu, wt %). In some embodiments, the bonding layer 120 is made of SAC305 (Sn-3.0Ag-0.5Cu, wt %).

In some embodiments, the bonding layers 122 and 120 are electrically conductive. In some embodiments, the thermal conductive element 118 is electrically connected to the conductive pad 106B. In some embodiments, the conductive pad 106B is a power pad of the chip package 100. In some other embodiments, the conductive pad 106B is a ground pad of the chip package 100.

In some embodiments, heat generated during the operation of the semiconductor dies 108A and 108B may be led out through the thermal conductive element 118. Therefore, the reliability and performance of the chip package structure 10 are improved.

Figure 2:
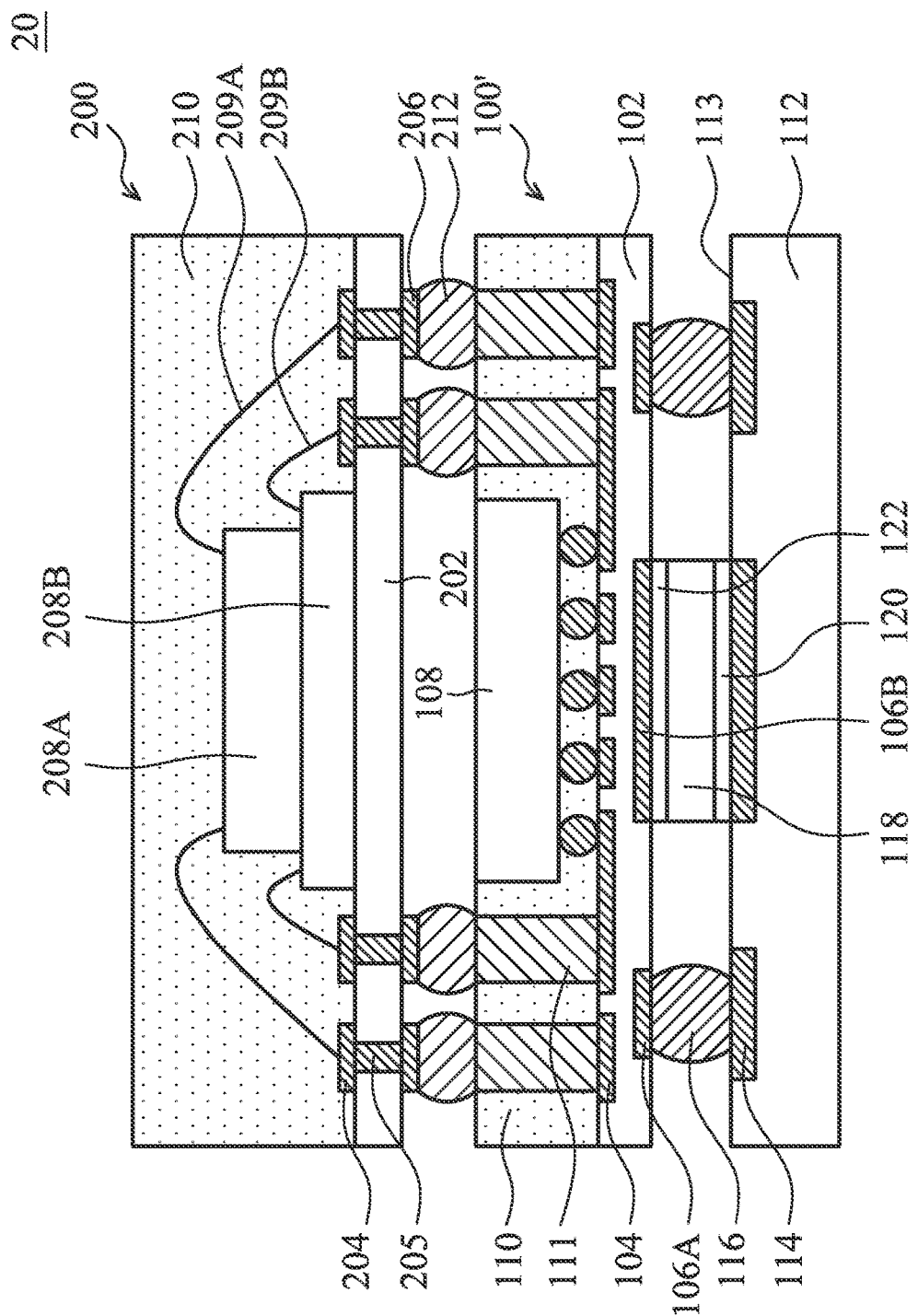
FIG. 2 is a cross-sectional view of a chip package structure, in accordance with some embodiments.

Embodiments of the disclosure have many variations. In some embodiments, the chip package structure includes multiple chip packages. FIG. 2 is a cross-sectional view of a chip package structure 20, in accordance with some embodiments. The chip package 20 includes a chip package 200 disposed over a chip package 100'. In some embodiments, the chip package 200 is bonded to the chip package 100' through conductive elements 212. The conductive elements 212 include, for example, solder bumps.

In some embodiments, the chip package 200 includes a substrate 202. The substrate 202 may include a dielectric material such as an organic material. In some embodiments, the organic material includes polypropylene (PP) with glass fiber, epoxy resin, polyimide, cyanate ester, other suitable materials, or a combination thereof. In some other embodiments, the substrate 202 includes a semiconductor material such as silicon.

As shown in FIG. 2, conductive pads 204 and conductive pads 206 are formed over and/or at opposite surfaces of the substrate 202, in accordance with some embodiments. Each of the conductive pads 204 is electrically connected to a corresponding one of the conductive pads 206. In some embodiments, conductive lines and/or conductive vias are formed in the substrate 202. The conductive lines and/or conductive vias form the electrical connections between conductive pads formed over and/or at opposite surfaces of the substrate 202.

In some embodiments, the chip package 200 includes one or more semiconductor dies such as semiconductor dies 208A and 208B. The semiconductor dies 208A and 208B are disposed over the substrate 202. In some embodiments, the semiconductor dies 208A and 208B have different functions. In some other embodiments, the semiconductor dies 208A and 208B have similar functions. In some embodiments, bonding wires 209A are used to form electrical connections between the semiconductor die 208A and the corresponding conductive pads 204. In some embodiments, bonding wires 209B are used to form electrical connections between the semiconductor die 208B and the corresponding conductive pads 204.

In some embodiments, the chip package 100 includes a molding compound layer 210 formed over the substrate 202. The molding compound layer 210 surrounds the semiconductor dies 208A and 208B and protects the semiconductor dies 208A and 208B from being damaged and/or polluted.

The chip package 100' is similar to the chip package 100. In some embodiments, the chip package 100' includes multiple conductive structures 111 which penetrate through the molding compound layer 110. The conductive structures 111 form electrical connections between the conductive pads 104 and the conductive elements 212.

Similar to the embodiments shown in FIG. 1, the chip package 100' is bonded to the printed circuit board 112 by the conductive elements 116 and the thermal conductive element 118, as shown in FIG. 2 in accordance with some embodiments. In some embodiments, heat generated during the operation of the semiconductor dies 108A, 108B, 208A and 208B may be led out through the thermal conductive element 118. Therefore, the reliability and performance of the chip package structure 20 are improved.

Embodiments of the disclosure have many variations. For example, there are multiple thermal conductive elements formed between the chip package and the printed circuit board, such as that shown in FIG. 1. Alternatively, there is only one thermal conductive element formed between the chip package and the printed circuit board, such as that shown in FIG. 2. The shapes, distribution, and sizes of the thermal conductive element(s) have many variations. FIGS. 3A-3D are top views of a substrate and conductive pads of a chip package structure, in accordance with some embodiments.

Figure 3B:
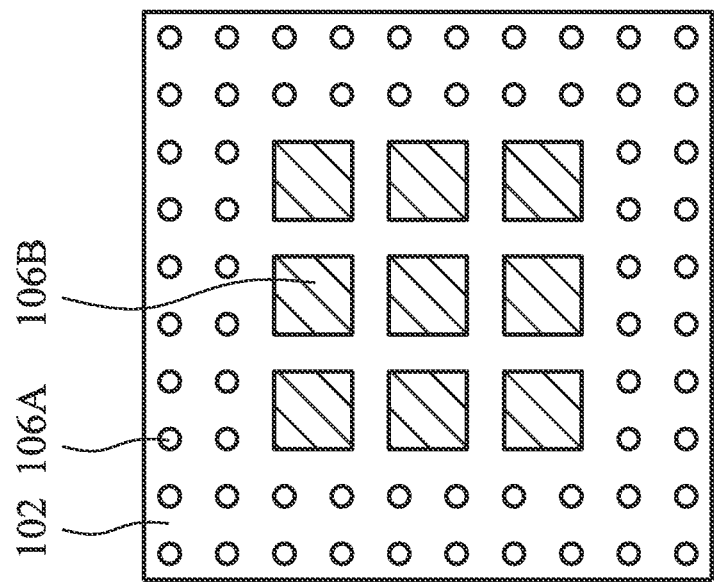
FIGS. 3A-3D are top views of a substrate and conductive pads of a chip package structure, in accordance with some embodiments.
Figure 3A:
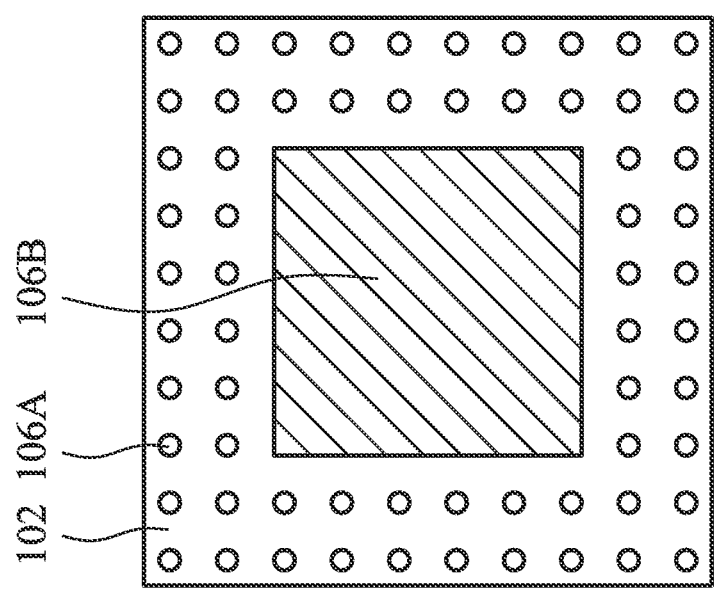

FIG. 3A shows a top view of the substrate 102 and the conductive pads 106A and 106B, which also represents the distribution of the thermal conductive element 118 and the conductive elements 116 formed thereon. In some embodiments, the chip package structure includes a single conductive pad 106B which has the shape of a square. In these cases, the shape of the thermal conductive element 118 is also a square.

As shown in FIG. 3B, the chip package structure includes multiple conductive pads 106B, in accordance with some embodiments. In these cases, the chip package structure includes multiple thermal conductive elements 118. In some embodiments, these thermal conductive elements 118 are arranged into an array. In some embodiments, the shapes and/or the sizes of the conductive elements 118 are substantially the same. In some embodiments, each of the thermal conductive elements 118 is square-shaped. For example, nine square thermal conductive elements 118 are arranged into an array.

Figure 3D:
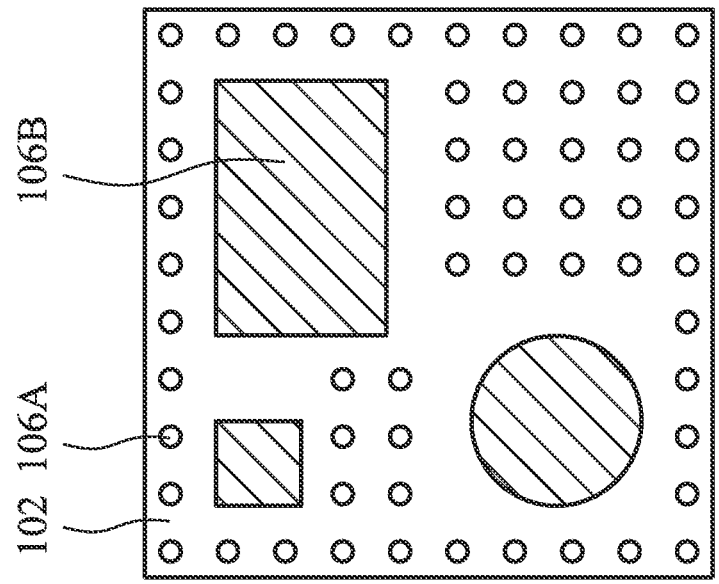
Figure 3C:
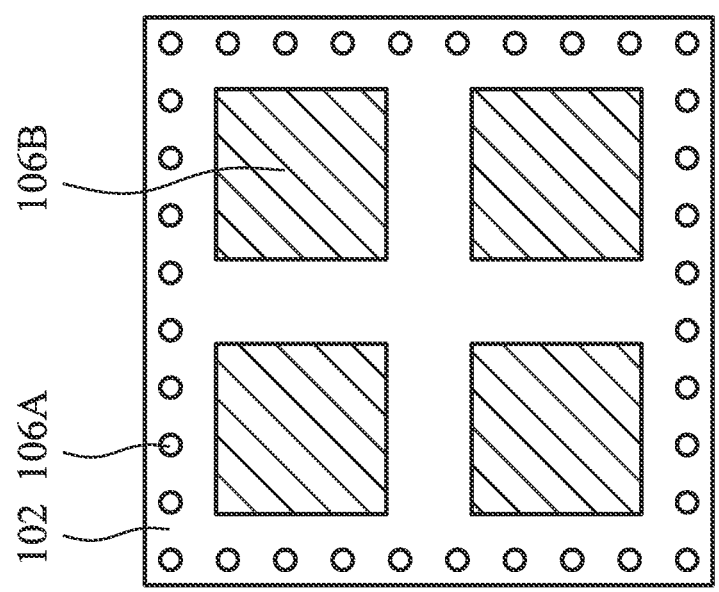

FIG. 3C shows that the chip package structure includes multiple conductive pads 106B arranged into an array, in accordance with some embodiments. In some embodiments, the shapes and/or the sizes of the conductive pads 106B are substantially the same. For example, the conductive pads 106B are square and are substantially the same size. In these cases, the thermal conductive elements 118 are also arranged into an array and are square. In some other embodiments, the chip package structure includes more or fewer thermal conductive elements 118. For example, the chip package structure includes sixteen thermal conductive elements which are arranged into an array. In some embodiments, some of the thermal conductive elements are electrically connected to power pads in the chip package, and some of other thermal conductive elements are electrically connected to ground pads in the chip package.

FIG. 3D shows that the chip package structure includes multiple conductive pads 106B which have different shapes and/or sizes, in accordance with some embodiments. The conductive pads 106B may be positioned at locations where more heat may be generated. In these cases, the thermal conductive elements 118 also have different shapes and/or sizes. The thermal conductive elements 118 are positioned at specific locations to lead out the heat.

Embodiments of the disclosure form one or more thermal conductive elements between the chip package and the printed circuit board. A metal foil, such as a copper foil, may be used as the thermal conductive element. Due to the thermal conductive element, heat generated during the operation of the semiconductor dies may be led out. Therefore, the reliability and performance of the chip package structure are improved.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chip package structure, comprising:
a first chip package over a printed circuit board;
a second chip package over the first chip package;
a plurality of conductive bumps extending between a substrate of the first chip package and the printed circuit board;
a plurality of thermal conductive elements extending between the substrate of the first chip package and the printed circuit board, each of the thermally conductive elements being formed of metal foil and exhibiting a sidewall perpendicular to the printed circuit board;
a first bonding layer between the plurality of thermal conductive elements and the first chip package; and
a second bonding layer between the plurality of thermal conductive elements and the printed circuit board;
wherein each of the thermal conductive elements has a thermal conductivity higher than a thermal conductivity of each of the conductive bumps,
wherein the thermal conductive elements are connected to conductive pads, the conductive pads being positioned under a source of heat such that the thermally conductive elements connected thereto dissipate heat from the source of heat, with at least some of the thermal conductive elements exhibiting different shapes or sizes.

2. The chip package structure as claimed in claim 1, wherein the conductive bumps comprise solder bumps, solder balls, or a combination thereof.

3. The chip package structure as claimed in claim 1, wherein each of the thermal conductive elements comprises a copper foil.

4. The chip package structure as claimed in claim 1, wherein the first bonding layer and the second bonding layer are made of a solder material.

5. The chip package structure as claimed in claim 1, wherein the first bonding layer and the second bonding layer are made of different solder materials.

6. The chip package structure as claimed in claim 1, wherein the thermal conductive elements are arranged into an array.

7. The chip package structure as claimed in claim 1, wherein each of the thermal conductive elements has a square shape.

8. The chip package structure as claimed in claim 1, wherein at least one of the thermal conductive elements is wider than the conductive bumps.

9. The chip package structure as claimed in claim 1, wherein the chip package comprises a plurality of semiconductor dies.

10. The chip package structure as claimed in claim 1, wherein the at least some of the thermal conductive elements exhibit different shapes or sizes in a plane parallel to a plane of the substrate.

11. A method for forming a chip package structure, comprising:
providing a first chip package having a substrate and a semiconductor die supported by the substrate;
providing a second chip package;
providing a printed circuit board;
bonding the substrate of the first chip package to the printed circuit board by a plurality of conductive bumps and a plurality of thermal conductive elements, each of which extends between the substrate and the printed circuit board,
wherein each of the thermal conductive elements is formed of metal foil and exhibits a sidewall perpendicular to the printed circuit board,
wherein a first bonding layer is disposed between the plurality of thermal conductive elements and the first chip package and a second bonding layer is disposed between the plurality of thermal conductive elements and the printed circuit board,
wherein each of the thermal conductive elements has a thermal conductivity higher than a thermal conductivity of each of the conductive bumps,
wherein the thermal conductive elements are connected to conductive pads, the conductive pads being positioned under a source of heat such that the thermally conductive elements connected thereto dissipate heat from the source of heat, with at least some of the thermal conductive elements exhibiting different shapes or sizes,
wherein some of the thermal conductive elements are electrically connected to power pads of the first chip package, and some of other thermal conductive elements are electrically connected to ground pads of the first chip package; and
bonding the second chip package to the first chip package by a plurality of solder bumps.

12. The method for forming a chip package structure as claimed in claim 11, further comprising:
bonding the thermal conductive elements to the substrate of the first chip package by the first bonding layer; and
bonding the thermal conductive elements to the printed circuit board by the second bonding layer after the thermal conductive elements are bonded to the first chip package.

13. The method for forming a chip package structure as claimed in claim 12, wherein the first bonding layer has a melting point higher than that of the second bonding layer.

14. The method for forming a chip package structure as claimed in claim 11, wherein the at least some of the thermal conductive elements exhibit different shapes or sizes in a plane parallel to a plane of the substrate.

* * * * *